US005561773A

United States Patent [19]
Kalish et al.

[11] Patent Number: 5,561,773
[45] Date of Patent: Oct. 1, 1996

[54] PROGRAMMABLE, MULTI-PURPOSE VIRTUAL PIN MULTIPLIER

[75] Inventors: David M. Kalish, Laguna Niguel; Saul Barajas, Capistrano Beach; Bruce E. Whittaker, Mission Viejo, all of Calif.

[73] Assignee: Unisys Corporation, Blue Bell, Pa.

[21] Appl. No.: 56,324

[22] Filed: Apr. 30, 1993

[51] Int. Cl.[6] .............................. G06F 11/00; G06F 7/38; H01J 3/00

[52] U.S. Cl. ......................... 395/284; 395/700; 395/500; 235/73; 326/40; 326/41; 371/22.3; 371/22.6; 364/DIG. 2

[58] Field of Search .............................. 371/22.2; 326/39, 326/40, 41, 45; 395/275, 700; 364/926

[56] References Cited

U.S. PATENT DOCUMENTS 4,168,796  9/1979  Fulks et al. .............................. 371/22.6
5,027,011  6/1991  Steele ......................................... 326/40

OTHER PUBLICATIONS

Microsoft Press, "Computer Dictionary 2nd Edition", 1993, pp. 141-142.

Primary Examiner—Gail O. Hayes
Assistant Examiner—Felicia Ives
Attorney, Agent, or Firm—Alfred W. Kozak; Mark T. Starr; Robert R. Axenfeld

[57] ABSTRACT

A system and circuitry is provided by which certain selected embedded pins of an integrated circuit gate array may be provided with dual functions, that is to say, they may act either as receivers of an externally sourced input signal or as transmitters of an internally generated output signal. Each selected input/output pin is controlled by an associated flip-flop residing in a chain of flip-flops so that an associated flip-flop will determine the condition of two buffer-drivers attached to each input/output pin. While the first buffer-driver is tri-stated (disabled), then the embedded pin operates as an input receiving function. When the first buffer-driver is enabled, the embedded I/O pin operates as the conveyer of an output signal from the internal output logic.

6 Claims, 2 Drawing Sheets

PROGRAMMABLE, MULTI-PURPOSE VIRTUAL PIN MULTIPLIER

FIELD OF THE INVENTION

This disclosure relates to methods for multiplying the effective pin capability on gate array chips beyond the number of the actual physical pin units available.

BACKGROUND OF THE INVENTION

Integrated circuit chips such as application specific integrated circuits, (ASICs) and very large scale integrated circuits, (VLSIs), are manufactured with a limited number of connection pins which allow communication to and from the environment external to the chip. For example, an input pin permits a chip to receive data from the surrounding board logic while an output pin permits the chip to send data outward to the external board logic.

Due to the size of integrated circuit chips, it is unfortunate that the number of pins available for input-output communications are limited due to the small size of the integrated circuit chip, and it is most important to optimize the use of the input pins and the output pins.

In any chip there are signals that are absolutely necessary for proper operation of the chip and require dedicated input and output pins in order to perform the functions that the chip logic and the board logic require. However, with the ability to provide other signals in addition to the absolute necessary signals, it will be found to be a valuable asset if certain other enhancement signals can be used and assigned to the pins as well. This enhancement could be the situation for two possible reasons:

(1) The added visibility of signals or state conditions inside the chip can be useful in a debugging environment;

(2) In situations where problems are encountered, additional input signals, if available, could help control some of the logic inside the chip, while some enhancing additional output signals could also help control some of the external board logic, especially in programmable array logic, PALs.

With the added flexibility as indicated by (1) and (2) described above, this flexibility can prevent the need to redesign a chip which would be costly in time, in scheduling and money involved.

It may be observed that there could be a more costly alternative by the use of a much larger chip with a greater quantity of available pins. However, in terms of both price of the chip and the required extra space that would be required in mounting on a PC Board, it would be seen that this is not a very desirable option. Thus it is most cost effective and important to make the optimal use of all the pins that are available on a chip.

One method of providing a greater optimal use of the available pins that come with an integrated circuit chip would be to provide circuitry and methods by which certain of the fixed pins in the chip could be used in a dual capacity, that is to say sometimes used as a pin for input signals and sometimes used as a pin for output signals depending on certain controlled conditions.

The object of the presently described system and method is to make it possible for certain ones of the scarce connection pins on an integrated circuit chip to be used in a dual functional capacity, that is, sometimes to be used for bringing input signals in and sometimes to use the same pin for output signals out to external units.

SUMMARY OF THE INVENTION

The present disclosure provides a simple inexpensive technique by which a pin or a number of pins in an integrated circuit chip can be programmed to provide a multi-purpose function so that the selected pin can operate either as an output pin for output signals or as an input pin for receiving input signals.

Each pin of the integrated circuit chip which is selected for a dual functional multi-purpose operation is provided with two sets of control circuitry, one set of which permits the logic of the chip to send out an output signal on the pin, or alternatively another set of control circuitry which permits an input signal to enter the selected pin and convey a signal to input logic within the chip but which operates such that only one of the input or output signals will be operative at any given time. The operative effect of one or the other of the control gates is selected by a tri-state control circuit with an output buffer which is regulated by output signals from a shift chain which can control the pin to be either an input receiving pin or an output transmitting pin.

DESCRIPTION OF PREFERRED EMBODIMENT

Figure 1:
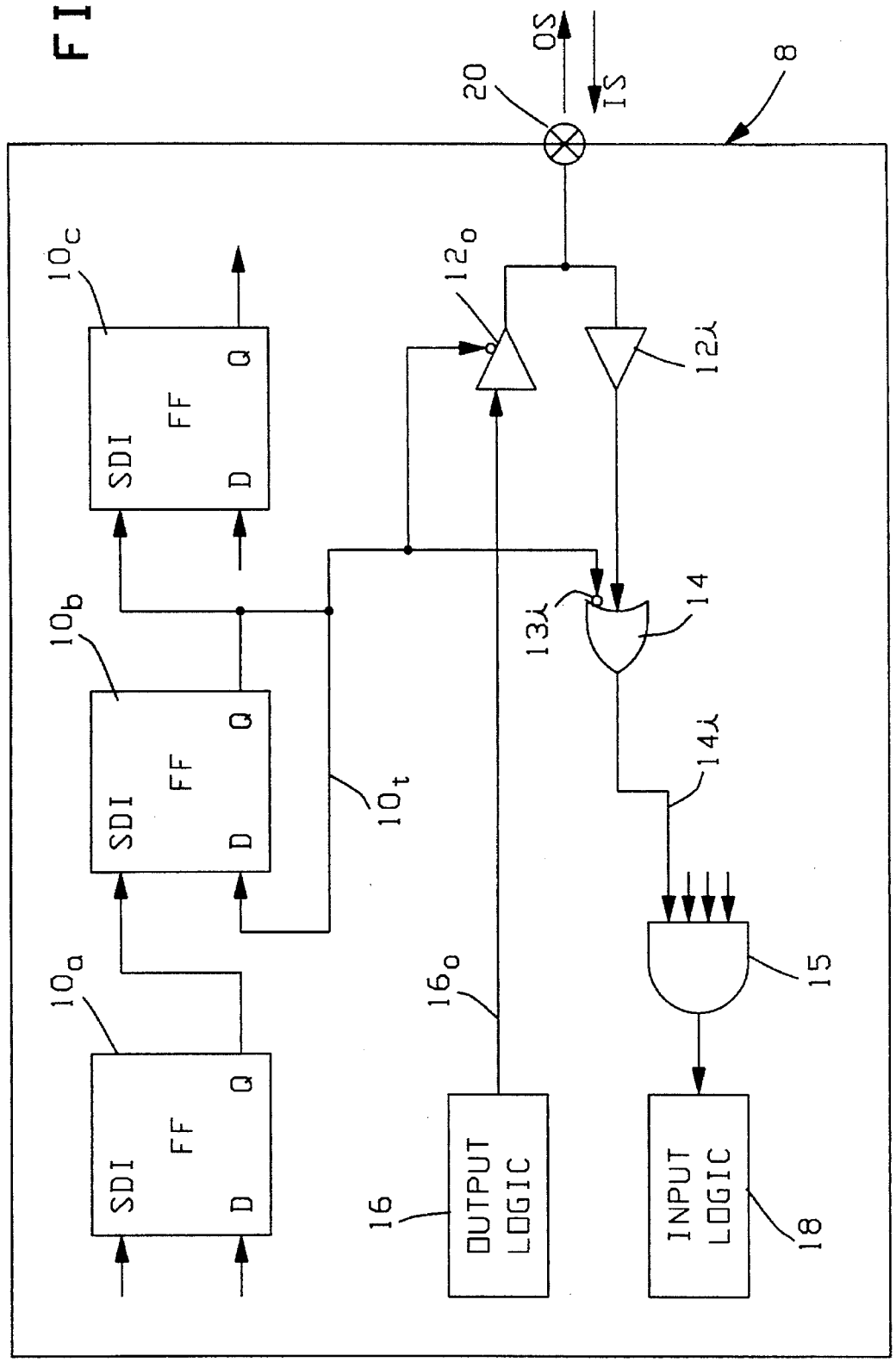
FIG. 1 is a diagram of an integrated circuit chip showing the normal input logic and output logic which is capable of operating through the dual-purpose input/output pin.

As seen in FIG. 1, an integrated circuit chip 8 is seen to have, for exemplary purposes, a pin 20 which can be used to communicate into and out of the integrated circuit 8.

Within the integrated circuit 8, there is seen a shift chain of flip-flops designated $10_a$, $10_b$, and $10_c$... $10_n$. These flip-flops are operated by a maintenance controller 6 (FIG. 2) which is external to the chip. However, the maintenance controller 6 via flip-flop $10_b$, can provide a signal on line $10_t$ which is conveyed to the tri-state buffer driver $12_0$ and also to the OR gate 14.

The normal logic circuitry 16 of the integrated circuit chip 8 is seen to have an output line $16_0$ which is enabled to pass through the buffer driver $12_0$ in order to connect to the multiple purpose pin 20 in order to provide an output signal OS when the buffer driver $12_0$ is enabled by the signal on line $10_t$.

If a pin 20 is switched from an output function to an input function, the buffer driver $12_0$ prevents the signal pn line $16_0$ from influencing the input signal IS.

Likewise, on the other hand, when the buffer driver $12_0$ is "not enabled", then the multiple purpose pin 20 provides an input signal function permitting the input signal IS to operate through the buffer-driver $12_i$ and through the OR gate 14 and via line $14_i$ to the AND gate 15 to be conveyed to the input receiving logic 18 of the chip 8.

It will be seen that when the OR gate 14 is enabled (by the signal on line $10_t$) for passing of an input signal, then the tri-state control buffer driver $12_0$ is disabled, and vice versa. When the tri-state control buffer driver $12_0$ is enabled to permit output signals, then at the same time the OR gate 14 is disabled so that no signals (OS) can pass through to the input logic 18.

If the pin 20 is used for an output signal function, then gate 14 prevents the signal on $16_0$ from wrapping around and influencing the input logic 18 since it could force a "1" to AND gate 15. Actually, gate 15 could be considered part of the input logic circuitry 18. If any one of the inputs to gate 15 were "0", then no signal could get through to input logic 18.

The other inputs to AND gate 15 might be used, for example, to control the loading of a register (in logic unit 18). Then if any input to gate 15 goes "low"=0, the register would be loaded with signals from pin 20 as "IS" (input signal function).

Figure 2:
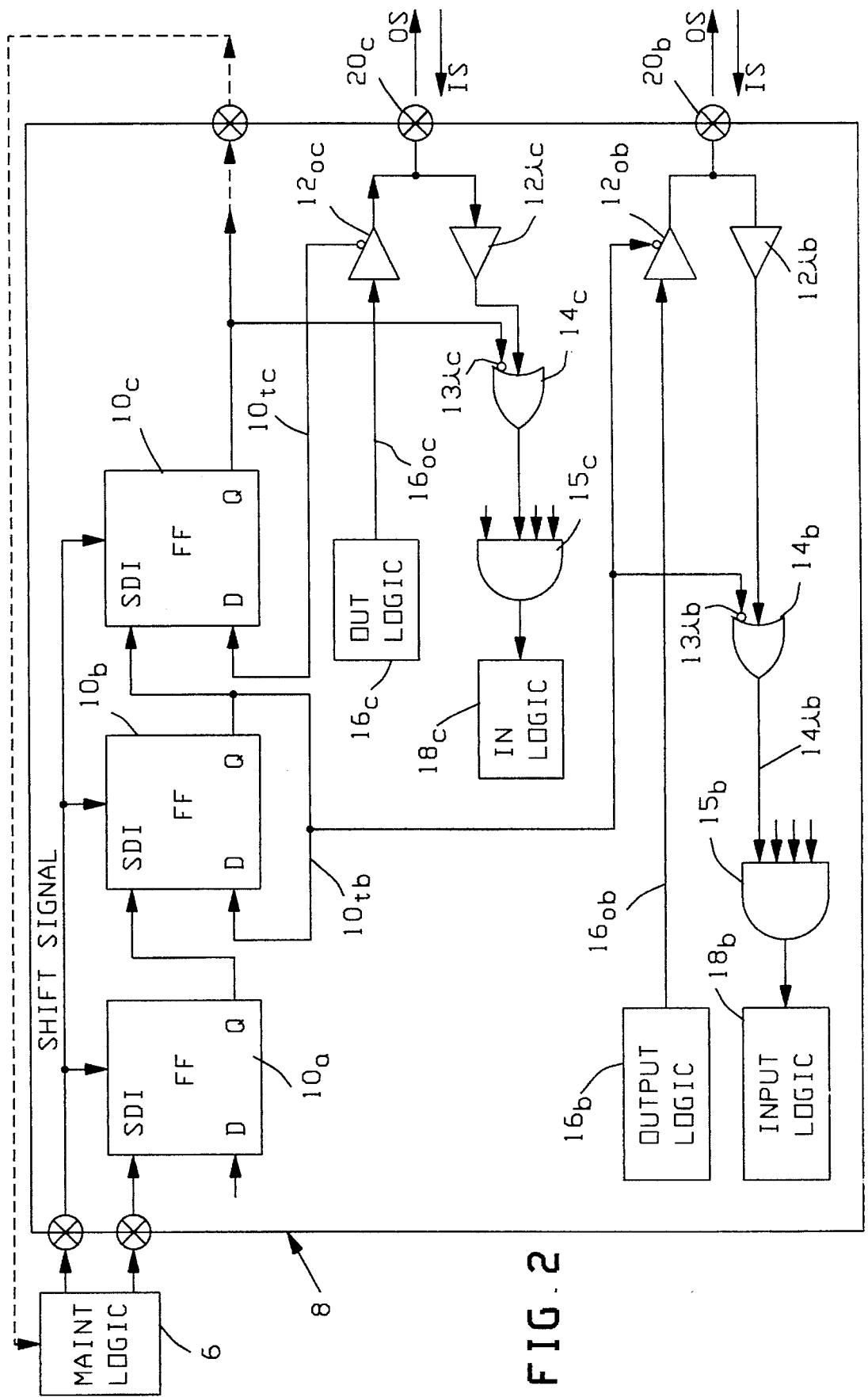
FIG. 2 is an amplified diagram of the integrated circuit chip showing how a maintenance processor can program selected flip-flops to control one or more dual functioning input-output pins of the chip.

When the system is being initialized, the maintenance logic 6, FIG. 2, will "set" or "clear" a flip-flop such as $10_b$ or $10_c$, etc. to provide a control function for each specifically selected gate array pin such as $20_b$ of FIG. 2.

Then in "normal operation" of the chip, each specific flip-flop will remain in the "set" initialized state and operate to lock in the function of that particular pin with which it is associated. In order to change the function (directional operation) of any specified pin, this merely requires a simple change in the software controlling the maintenance logic which can re-program the flip-flop associated with a particular pin.

In future configurations that may be required, the future initialization program would then be used to set the particular control flip-flop according to the new software pattern. This would then result in a new function for that particular pin controlled by the flip-flop setting in the snake of the shift chain of flip-flops.

Referring to FIG. 1, it will be seen that there is a set of maintenance controlled flip-flops $10_a$, $10_b$, $10_c$, etc. The tri-state control signal on line $10_t$ and the controlling units for determining input/output functioning involve the output buffer-driver $12_0$ and the input buffer-driver $12_i$.

The tri-state control signal $10_t$, if equal to "0", will allow the integrated circuit chip 8 to drive a signal "out" of the buffer $12_0$ through the pin 20.

Thus if the flip-flop $10_b$ provides a "0" level signal on line $10_t$ to the buffer gate $12_0$ then the output logic 16 of the chip will be permitted to drive a signal outward from the pin 20 while no input signal could operate to come inward onto pin 20 due to the blocking action of OR gate 14.

If the tri-state control signal on line $10_t$ is equal to "1", the output buffer-driver $12_0$ will be "tri-stated", thus causing the pin 20 to become an input functioning pin. This input condition and function is controlled by the flip-flop $10_b$ of FIG. 1.

Also, if a pin is to be selected and designated as a "output functioning pin", there must be some logic to prevent the input function, since the buffer $12_0$ wraps the output signal back into the chip via $12_i$. This "wrap around prevention logic" is shown in FIG. 1 through the use of the OR gate 14.

It may be noted in FIG. 1, that the input signal, IS, on pin 20 will only effect the wrap around prevention logic 14 when line $10_t$ is in the "low" state. Line $10_t$ has an inverter $13_i$ which inverts the signal to the OR gate 14 to the high (equall) state.

This permits the system to force the signal on $10_t$ to a "high state" without effecting the input OR gate logic 14 (wrap around logic prevention) when the signal pin 20 is being defined as an output signal pin OS.

Table I shows a truth table of the possible states of the control logic on line $10_t$. In lines 1 and 2 of the Table I, the output signal (OS) is being driven "out" of the chip since the tri-state control line $10_t$ is "low". Thus the pin, such as pin 20 for example, is a function of the output signal OS.

TABLE I

TRUTH TABLE FOR CONTROL LOGIC

| OUTPUT SIGNAL (OS) | PIN | Line $10_t$ TRI-STATE CONTROL (TC) | $12_0$ OUTPUT BUFFER-DRIVER (OB) | INPUT SIGNAL (IS) |
|---|---|---|---|---|
| 1. 0 | 0 | 0 (Low) | EN | 1 |
| 2. 1 | 1 | 0 | EN | 1 |
| 3. X | 0 | 1 (High) | TS | 0 |
| 4. X | 1 | 1 | TS | 1 |

EN = output buffer-driver is enabled to drive out of the chip
TS = output buffer-driver is tri-stated; it cannot drive out of the chip
X = "don't care" state, can be either 0 or 1 without affecting the output function In lines 3 and 4 of Table I, the selected pin is driving the signal "into" the chip because the tri-state control line is "high" so that the value of the output signal is irrelevant in determining the value of the input signal IS. This means that buffer-driver $12_0$ is essentially a high impedance unit stopping all signal flow.

The Table I shows the state of the output buffer-driver $12_0$ which is enabled "EN" to drive when the tri-state control signal $10_t$ is "low". The buffer-driver $12_0$ is tri-stated (TS) when the tri-state control signal $10_t$ is "high", and presents an open circuit of high impedance.

The control flip-flops such as $10_a$, $10_b$, $10_c$, are part of the maintenance shift chain which is a series of flip-flops connected together so that the output of the first flip-flop is connected to the "shift data input" of the second flip-flop, etc. During initialization, the flip-flop is loaded using the shift data input, but during "normal operation" the shift mechanism is disabled and the flip-flops remain in a stable condition, according to how they have been programmed.

It is only when some change situation is deemed necessary that the flip-flops can be reprogrammed to change the function of a selected multiple function pin such as 20 into an output signal pin or an input signal pin.

FIG. 2 is a more detailed diagram of the present system and method for providing dual purpose functions to an invertible I/O pin of a gate array chip.

As previously described in FIG. 1, the pin $20_b$ was illustrated as having an output function and an input function by means of controls on line $10_{tb}$ onto the buffer driver $12_{0b}$ and to the OR gate $14_b$. Here it was noted that the control signal mechanism for determining whether pin $20_b$ was for an input function or for an output function was determined by the setting of the flip-flop $10_b$ which conveyed the control signal on line $10_{tb}$.

Likewise, should it be desired to control another invertible input/output pin such as $20_c$ of FIG. 2, it will be noted that a similar set of connections and logic are provided from, in this case, the flip-flop $10_c$. Here the control signal $10_{tc}$ is provided onto the driver buffer $12_{0c}$ and also to the OR gate $14_c$.

Thus, when the buffer-driver $12_{0c}$ is enabled, the output logic $16_c$ can transmit on line $16_{0c}$ through the buffer-driver $12_{0c}$ and out through the embedded pin $20_c$ to provide the output signal OS.

Likewise, if the flip-flop $10_c$ provided the (high equal to 1) signal $10_c$ onto the buffer-driver $12_{0c}$ to cause the buffer-driver to be tri-stated (high impedance), this means that a "high" signal was provided on line $10_{tc}$ onto the buffer-driver $12_{oc}$, and in this case, the high signal is provided to the OR gate $14_c$ but is inverted by inverted $13_{ic}$ to provide a "low" signal (equal 0) to the OR gate $14_c$. This "enables" the OR gate $14_c$ permitting the input signal to arrive through pin $20_c$ and to be conveyed through the buffer-driver $12_{ic}$ over through the OR gate $14_c$ to the AND gate $15_c$ for conveyance to the input logic $18_c$.

As also seen in FIG. 2, the maintenance logic 6 provides a shift signal, during initialization, in order to program or preset each of the flip-flops $10_a$, $10_b$, and $10_c$. Then according to the settings of the flip-flops (FIG. 2) of $10_b$ and $10_c$, this will determine whether or not the embedded pin $20_b$ and the embedded pin $20_c$ are to function either as input receivers or as output transmitters.

The disclosed system and method provides a simple cost effective way to achieve flexibility in ASIC chip design or VLSI chip design while permitting additional utilization from a limited number of pins. As described, this is accomplished by modifying a pin to behave in two separately different functional ways.

In one case of a given computer system, for example, the ASIC cache gate array had 256 usable pins. But now with the use of this system and design technique, six pins were modified in order to effectively yield 262 virtual functional pins.

As a direct result of this system and method, there can be provided a more efficient debugging program due to the greater visibility of internal signals with the added bonus that there is less chance of requiring a costly chip redesign, since due to the existence of the additional input control signals, it is possible to reprogram the internal functions of the chip. As a result of the provision of this flexible functionality, a great saving can be provided while still keeping the chip size in its small version and also initiating the overall package in its size which enables it to be used on PC Boards without consuming large amounts of real estate.

While other variations of the above described concept may be effectuated, it should be understood that the present invention is encompassed as defined in the following claims.

What is claimed is:

1. In an application specific integrated circuit gate array chip having multiple I/O pins for connection to outside circuitry, a method of enabling a selected plurality of I/O pins to be immediately programmed by external maintenance means on each initialization cycle, for either receiving external signals as input to said chip or for sending external logic signals out of said chip to said outside circuitry, said method comprising the steps of:

(a) setting the on-off state of each one of a series of flip-flops where each flip-flop is associated with a single I/O pin to set the high impedance/low impedance condition of a pair of buffer-drivers connected to each one of said I/O pins;

(b) enabling a first one of said pair of buffer-drivers, associated with each one of said selected I/O pins, to transmit internal logic signals out through said I/O pin;

(c) preventing, said transmitted logic signals out, from re-entering said gate array chip;

(d) disabling said first one of said pair of buffer-drivers and enabling said second one of said buffer-drivers to permit an externally sourced input signal from said I/O pin into said application specific integrated circuit gate array chip.

2. A network in an application specific integrated circuit gate array chip for enabling a selected plurality of an unlimited number of terminal pins to function either as a receiver of external sourced input signals or as a transmitter of internal logic output signals and wherein an external maintenance logic means operates to immediately program each one of a plurality of flip-flops where each flip-flop is associated with a first and second set of buffer-drivers controlling the signal direction capability of each selected terminal pin, comprising:

(a) said plurality of flip-flops having settable on-off state conditions settable by said external maintenance logic means wherein each flip-flop controls a particular one of an associated buffer-driver means;

(b) said selected plurality of an unlimited number terminal pins being settable to function as a receiver or transmitter of signals as controlled by said associated buffer-driver means;

(c) each said buffer-driver means including:

(c1) a first buffer-driver for enabling said internal logic output signals to be transmitted from said chip via said terminal pin to an external element when turned on by an enabling signal from said associated flip-flop;

(c2) a second buffer-driver for enabling said terminal pin to receive said externally sourced input signals when said first buffer-driver is disabled and including an output signal to a gating input means;

(c3) said gating input means to receive the said output signal of said second buffer-driver and transmit the said external sourced input signal to internal gate array logic when said first buffer-driver is disabled;

(d) means, when said first buffer-driver is enabled, for blocking said logic output signals from re-entering said gate array chip;

(e) a shift register including said plurality of flip-flops;

(f) said external maintenance logic means for setting each of said flip-flops into a predetermined on-off state;

(g) wherein each selected one of said plurality of flip-flops is set to either enable its associated first buffer-driver to pass internally generated logic signals to said terminal pin for external transmission output while disabling said second buffer-driver, or to disable said first buffer-driver and enable said second buffer-driver to pass externally sourced input signals into said chip.

3. The network of claim 2 wherein said first buffer-driver includes:

(a) means to receive a signal reflecting said predetermined state of its associated flip-flop for setting said first buffer-driver into a low impedance condition or a high impedance condition.

4. The network of claim 2 wherein said gating input means includes:

(a) means, sensitive to said signal reflecting said predetermined state of its associated flip-flop, for disabling/enabling the connection of input signals from said second buffer-driver to internal input logic in said chip.

5. A system for enabling each I/O pin of an unlimited multiplicity of I/O pins in an application specific integrated circuit gate array chip to function as either a receiver of input signals or transmitter of output signals comprising:

(a) means for enabling an internally generated output logic signal onto said I/O pin for external transmission while disabling said I/O pin's connection to internal logic in said chip;

(b) means for disabling said internally generated output logic signal from said I/O pin and enabling internal input logic to receive an externally sourced input signal;

(c) control means for immediately activating said means for enabling or said means for disabling including:

(c1) a plurality of flip-flops forming a chained sequence where each flip-flop is settable to either a "1" or "0" state by programming from an external maintenance means and each one of a plurality of said I/O pins is associated with a specific flip-flop which enables/disables its associated I/O pin as either an output transmitting terminal or an input receiving terminal.

6. Apparatus for virtually multiplying the usable number of I/O pins in an application specific integrated circuit gate array chip without physically adding additional I/O pins and permitting instant reprogrammability of the input or output function of each I/O pin during each new initialization cycle set up by a maintenance control means, said apparatus comprising:

(a) a selected plurality of I/O pins functioning as contact for either input signals to be received by said chip or as contact for output signals to be transmitted from said chip;

(b) a plurality of buffer-driver means associated with each I/O pin for connecting internally sourced output signals to said I/O pins for external transmission to external circuitry or alternatively, connecting externally sourced input signals into said chip;

(c) flip-flop means, programmable on each said initialization cycle, for setting each one of said plurality of buffer-driver means into an output mode or input mode;

(d) said maintenance control means, operating during each new initialization cycle, for instantly shifting in programming signals to each one of said buffer driver means;

(e) means for disabling connection from a selected I/O pin to internal input logic in said chip during output mode periods when said selected I/O pin is enabled for connection to internal output logic generated signals for transmission of said generated signals to said external circuitry.

* * * * *